(12) United States Patent  (10) Patent No.: US 9,310,820 B2
Alonso et al.  (45) Date of Patent: Apr. 12, 2016

(54) SYSTEM FOR THE ELECTRONIC MANAGEMENT OF PHOTOVOLTAIC CELLS AS A FUNCTION OF METEOROLOGY

(75) Inventors: Corinne Alonso, Ramonville Saint Agne (FR); Alona Berasategi, Idiazabal (ES); Cédric Cabal, Toulouse (FR); Bruno Estibals, Saint Thomas (FR); Stéphane Petibon, Deols (FR); Marc Vermeersch, Le Vésinet (FR)

(73) Assignees: Total Marketing Services, Puteaux (FR); CENTRE NATIONAL DE LA RECHERCHE SCIENTIFIQUE, Paris (FR)

(*) Notice: Subject to any disclaimer, the term of this patent is extended or adjusted under 35 U.S.C. 154(b) by 700 days.

(21) Appl. No.: 13/515,086

(22) PCT Filed: Dec. 10, 2010

(86) PCT No.: PCT/IB2010/055757
§ 371 (c)(1),
(2), (4) Date: Jun. 11, 2012

(87) PCT Pub. No.: WO2011/070548
PCT Pub. Date: Jun. 16, 2011

(65) Prior Publication Data
US 2012/0248880 A1   Oct. 4, 2012

(30) Foreign Application Priority Data
Dec. 11, 2009   (FR) .................................... 09 58900

(51) Int. Cl.
*H02J 1/00* (2006.01)
*G05F 1/67* (2006.01)
*H01L 31/02* (2006.01)

(52) U.S. Cl.
CPC ............ *G05F 1/67* (2013.01); *H01L 31/02021* (2013.01); *H02J 1/00* (2013.01); *Y02E 10/58* (2013.01); *Y10T 307/707* (2015.04)

(58) Field of Classification Search
CPC ........ H02J 1/00; G05F 1/67; H01L 31/02021; Y02E 10/58; Y10T 307/707
USPC ............................................................ 307/82
See application file for complete search history.

(56) References Cited

U.S. PATENT DOCUMENTS

| 4,636,931 A | 1/1987 | Takahashi et al. |
| 6,169,678 B1 | 1/2001 | Kondo et al. |

(Continued)

FOREIGN PATENT DOCUMENTS

| CN | 100553398 C | 6/2006 |
| CN | 101170205 A | 4/2008 |

(Continued)

OTHER PUBLICATIONS

Kjaer; et al.; "A Review of Single-Phase Grid-Connected Inverters for Photovoltaic Modules;" IEEE Transactions on Industry Applications; vol. 41; No. 5; Sep./Oct. 2005; pp. 1292-1306.

(Continued)

*Primary Examiner* — Hal Kaplan
(74) *Attorney, Agent, or Firm* — Daly, Crowley, Mofford & Durkee, LLP (57) ABSTRACT

The invention relates to a system for the electronic management of a photovoltaic generator, said system comprising a plurality of n static converters (11, 12, 13) connected in parallel, each converter (11, 12, 13) being electrically connected to at least one photovoltaic cell (10) of the generator. The number of converters connected is varied by varying the photovoltaic power, by comparing the generated power to thresholds P1, P2, ..., Pn−1 after a time delay t. The invention also relates to a generator comprising said system and to the associated control method.

16 Claims, 8 Drawing Sheets

(56) References Cited

U.S. PATENT DOCUMENTS

| | | | |
|---|---|---|---|
| 6,259,017 | B1 | 7/2001 | Takehara et al. |
| 6,285,572 | B1 * | 9/2001 | Onizuka et al. .............. 363/72 |
| 2005/0116671 | A1 | 6/2005 | Minami et al. |
| 2007/0248877 | A1 | 10/2007 | Qahoug et al. |
| 2009/0027001 | A1 | 1/2009 | Haines |
| 2011/0232714 | A1 | 9/2011 | Bhavaraju et al. |
| 2012/0106204 | A1 | 5/2012 | Imanishi et al. |
| 2012/0217948 | A1 | 8/2012 | Bouchez et al. |

FOREIGN PATENT DOCUMENTS

| | | |
|---|---|---|
| CN | 101405088 A | 4/2009 |
| EP | 1 047 179 B1 | 10/2000 |
| JP | S 59-017317 | 1/1984 |
| JP | H07325635 | 12/1995 |
| JP | H1023683 | 1/1998 |
| JP | H 10-69321 A | 3/1998 |
| JP | H11282554 | 10/1999 |
| JP | H 11-341816 | 12/1999 |
| JP | 2001-16859 A | 1/2001 |
| JP | 2006006019 | 1/2006 |

OTHER PUBLICATIONS

International Search Report of the ISA for PCT/IB2010/055757 dated Apr. 21, 2011.
International Search Report of the ISA for PCT/IB2010/055756 dated Apr. 21, 2011.
Office Action dated Dec. 14, 2014 for U.S Appl. No. 13/515,082; 31 pages.
Response to Office Action filed Apr. 3, 2015 for U.S. Appl. No. 13/515,052 17 pages.
Decision of Rejection dated Jul. 7, 2015 for Japanese Appl. No. 2012-542678; 5 pages.
Office Action dated Jul. 31, 2015 for U.S. Appl. No. 13/515,082; 15 pages.
Response to Jul. 31, 2015 Office Action as filed on Dec. 8, 2015 for U.S. Appl. No. 13/515,082; 17 pages.

* cited by examiner

SYSTEM FOR THE ELECTRONIC MANAGEMENT OF PHOTOVOLTAIC CELLS AS A FUNCTION OF METEOROLOGY

CROSS REFERENCE TO RELATED APPLICATIONS

This application is a National Stage application of PCT/IB2010/055757 filed on Dec. 10, 2010 and published in the French language, and entitled "SYSTEM FOR THE ELECTRONIC MANAGEMENT OF PHOTOVOLTAIC CELLS AS A FUNCTION OF METEOROLOGY" which claims priority to French application FR 0958900 filed on Dec. 11, 2009.

DOMAIN OF THE INVENTION

The present invention relates to the domain of photovoltaic generators and more specifically photovoltaic modules integrating the electronic system; a module of this type includes a photovoltaic generator and a system for the electronic management of photovoltaic cells.

TECHNOLOGICAL BACKGROUND

In a manner known per se, a photovoltaic generator (PVG) includes one or more photovoltaic (PV) cells connected in series and/or in parallel. In the case of inorganic materials, a photovoltaic cell essentially comprises a (pn or pin junction) diode composed on the basis of a semiconductor material. This material has the property of absorbing light energy, a significant part of which can be transferred to charge carriers (electrons and holes). The constitution of a (pn or pin junction) diode by the doping of two zones of type N and type P respectively—possibly separated by a non-doped region (referred to as "intrinsic" and designated by "i" in the pin junction)—allows the charge carriers to be separated for them then to be collected via electrodes which the photovoltaic cell comprises. The maximum potential difference (open-circuit voltage, $V_{OC}$) and the maximum current (short-circuit current, $I_{CC}$) that the photovoltaic cell can supply are a function of both the materials making up the cell as a whole and the conditions surrounding this cell (including illumination via the spectral intensity, temperature, etc.). In the case of organic materials, the models are markedly different—making further reference to the notion of donor and acceptor materials in which electron-hole pairs known as excitons are created. The objective remains the same: to separate the charge carriers to collect and generate a current.

Figure 1:
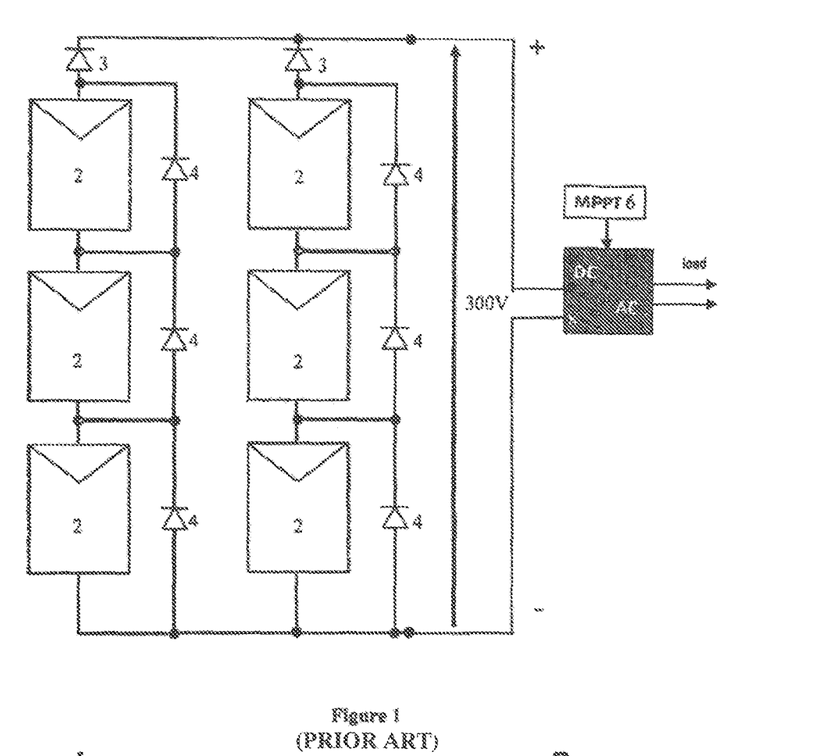
FIG. 1, already described, shows a diagram of a photovoltaic generator of the prior art.

FIG. 1 shows schematically an example of a photovoltaic generator (according to the prior art). Most photovoltaic generators comprise at least one panel, itself comprising photovoltaic cells connected in series and/or in parallel. A plurality of groups of cells can be connected in series to increase the total voltage of the panel; a plurality of groups of cells can also be connected in parallel to increase the intensity delivered by the system. In the same way, a plurality of panels can be connected in series and/or in parallel to increase the voltage and/or the amperage of the generator according to the application.

FIG. 1 shows a photovoltaic generator comprising two parallel branches, each containing three groups of cells 2. In order to guarantee the electrical safety of the photovoltaic generator, non-return diodes 3 and bypass diodes 4 can be provided. The non-return diodes 3 are connected in series to each parallel branch of the generator in order to avoid the flow in the cells of a negative current arriving from the load or from other branches of the generator. The bypass diodes 4 are connected in anti-parallel to the groups 2 of cells. The bypass diodes 4 enable the separation of a group 2 of cells presenting a deficiency or a shadowing problem and solve the problem of hot spots.

Figure 2:
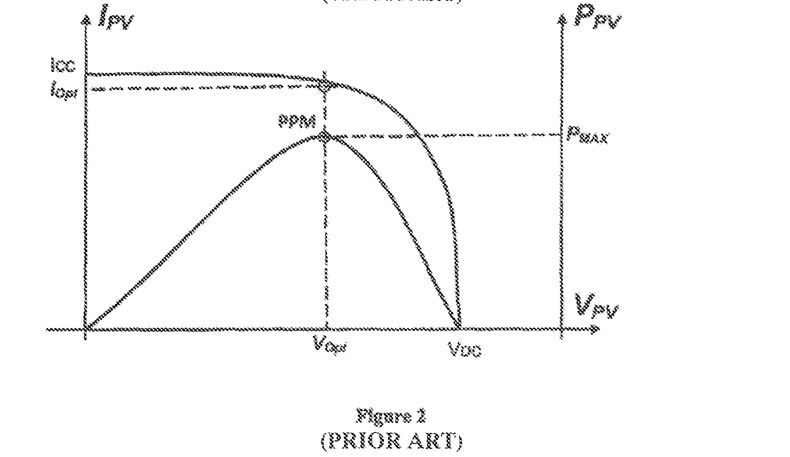
FIG. 2, already described, shows theoretical current/voltage and power characteristics of a photovoltaic cell.

The maximum voltage of the generator corresponds to the sum of the voltages of the cells of which it is comprised, and the maximum current that the generator can deliver corresponds to the sum of the maximum currents of the cells. The maximum voltage $V_{OC}$ of a cell is reached for a cell on no load, i.e. for a zero delivered current (open circuit) and the maximum current $I_{CC}$ of a cell is reached when its terminals are short-circuited, i.e. for a zero voltage on the terminals of the cell. The maximum values $V_{OC}$ and $I_{CC}$ depend on the technology and the material used to implement the photovoltaic cell. The maximum value of the current $I_{CC}$ also depends strongly on the level of insolation of the cell. A photovoltaic cell thus presents a non-linear current/voltage characteristic ($I_{PV}$, $V_{PV}$) and a power characteristic with a maximum power point (MPP) which corresponds to optimum voltage values $V_{opt}$ and optimum current values $I_{opt}$. FIG. 2 shows the current/voltage ($I_{PV}$, $V_{PV}$) and power/voltage ($P_{PV}$, $V_{PV}$) characteristics of a photovoltaic cell with its maximum power point (identified by PPM in the figure). Similarly, a photovoltaic generator will present a non-linear current/voltage characteristic and a power characteristic with a maximum power point. If a part of the cells is shadowed, or if one or more cells of the group is defective, the maximum power point MPP of this group will be displaced.

It is known to optimize the operation of a photovoltaic generator through the use of a command to search for the maximum power, known as a Maximum Power Point Tracker (MPPT). An MPPT command of this type can be associated with one or more static converters (CS) which, according to the applications, can be a direct-current/alternating-current (DC/AC) converter or a direct-current/direct-current (DC/DC) converter. FIG. 1 thus shows a DC/AC static converter 8 connected to the output of the generator and collecting the electrical energy produced by all of the cells of the generator to deliver it to a load. According to the requirements of the load, the converter can be made to increase or reduce the output voltage and/or to invert the output voltage. FIG. 1 thus shows an MPPT command 6 associated with the converter 8.

The MPPT command 6 is designed to control the converter(s) 8 in order to obtain an input voltage which corresponds to the optimum voltage value $V_{opt}$ of the photovoltaic generator (PVG), corresponding to the maximum point of the power characteristic. The maximum power point depends on a plurality of parameters that are variable through time, notably the insolation present, the temperature or the ageing of the cells or the number of cells in a functional state.

In this way, the output of the photovoltaic generator is not too adversely affected by the malfunction or shadowing of certain cells. The electrical output of the generator depends directly on the state of each photovoltaic cell.

The power delivered by the photovoltaic generator will vary as a function of the insolation. Notably, not one but two or three or even more converters can be used as a function of the power. The method consists in adapting the number of (cell or phase) converters as a function of the changes in the power produced by the PVG. In fact, the use of a single converter is not necessarily advantageous in order to manage substantial power variations, the conversion output being adversely affected. The output of a power converter constituted on the basis of a single phase (or of a single converter) reduces when the PV power supply is maximum, whereas the structure including three converters has a tendency to maintain a virtually constant output regardless of the delivered PV power. This will result in a greater transfer of energy to the battery.

Figure 3:
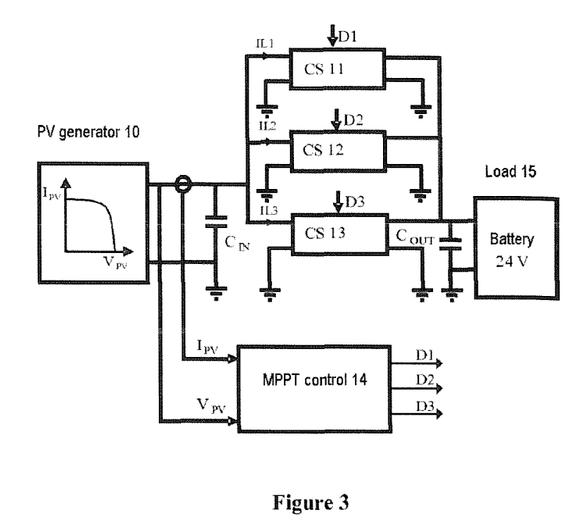
FIG. 3 shows a diagram of a PVC including a plurality of converters (here 3 static converters CS of BOOST type.

FIG. 3 shows an arrangement of this type, including at the output of the PV cells three CS (which, in this case, are BOOST converters). These converters are actuated as a function of the generator power in relation to the peak power of the device (Ppeak). In a known manner, when the power delivered by the PVG is less than or equal to one third of the Ppeak, one CS is used; when the power delivered by the PVG is between 1/3 and 2/3 of the Ppeak, 2 CS are used, and when the power delivered is greater than 2/3 of Ppeak, 3 CS are used.

In the event of meteorological changes, the number of converters involved will therefore change, since the power generated by the PVG will vary. These changes may be numerous in the course of one day and over the service life of the PVG. Numerous changes impose stresses on the components, notably those of the converters, which causes the devices to age.

There is therefore a need to reduce the ageing of the components of the PVG.

SUMMARY OF THE INVENTION

Thus, the invention provides a system for the electronic management of a photovoltaic generator, the system including:
- a plurality of n static converters (11, 12, 13) connected in parallel, each converter (11, 12, 13) being electrically connected to at least one photovoltaic cell (10) of said generator,
- the variation in the number of connected converters being effected through variation in the photovoltaic power, through comparison of the generated power with thresholds P1, P2, ... Pn−1, after a lag time t.

According to one embodiment, the lag time t lies between 3 and 20 minutes, preferably between 5 and 15 minutes.

According to one embodiment, the value of the time t depends on the state of the components of the converters.

According to one embodiment, the value of the time t depends on meteorological conditions, chosen notably according to the installation location of the generator and the season.

According to one embodiment with rotation of the CS in the system, the converters are connected in turn.

According to one alternative of this embodiment with rotation of the CS, the rotation of the converters is effected in the event of variation in the number of converters employed.

According to one alternative of this embodiment with rotation of the CS, the rotation of the converters depends on the state of the components of the converters.

The subject-matter of the invention is also a photovoltaic generator including:
- at least one photovoltaic cell;
- the management system according to the invention.

The subject-matter of the invention is also a method for controlling a photovoltaic generator, including:
- at least one photovoltaic cell;
- a plurality of n static converters (11, 12, 13) connected in parallel, each converter (11, 12, 13) being electrically connected to at least one photovoltaic cell (10);

said method including the steps of:
- determination of the power generated by said at least one photovoltaic cell and comparison with the peak power;
- comparison with threshold values P1, P2, Pn−1;

connection of i converters when the measured power value lies between Pi−1 and Pi or of all the converters if the measured power value is greater than Pn−1;
said connection being carried out after a lag time t if the connection conditions are still satisfied.

According to one embodiment, said method includes the following steps, implemented according to periods:
- determination of the power generated by said at least one photovoltaic cell and comparison with the peak power;
- comparison with the threshold value P1;
  - (a) if the value is lower than this threshold P1, a single converter is connected;
  - (b) if the value is higher than this threshold P1, a comparison is then made with a second threshold P2;
  - (b1) if the power is less than P2, 2 converters are connected;
  - (b11) a comparison is then made with the first threshold P1, and if the power value is higher than this threshold, the routine returns to step (b), and if the value is lower than this threshold P1, a lag time t is activated;
  - (b12) if the lag time has been activated, a comparison is then again made with the first threshold P1, and if the power value is higher than this threshold, the routine returns to step (b) after having reset the lag time, and if the value is lower than this threshold P1, the expiry or not of the lag time period is determined, and, if not, the comparison with the value P1 is resumed;
  - (b13) when the lag time period has expired, the routine then returns to step (a);
  - (b2) if the power is greater than P2, 3 converters are connected;
  - (b21) a comparison is then made with the second threshold P2, and if the power value is higher than this threshold, the routine returns to step (b2), and if the value is lower than this threshold P1, a lag time t is activated;
  - (b22) if the lag time has been activated, a comparison is then again made with the second threshold P2, and if the power value is higher than this threshold, the routine returns to step (b2) after having reset the lag time, and if the value is lower than this threshold P2, the expiry or not of the lag time period is determined, and, if not, the comparison with the value P2 is resumed;
  - (b13) when the lag time period has expired, the routine then returns to step (a) or step (b);
- repetition of the steps if necessary for n converters.

According to one embodiment with rotation of the CS, in the method according to the invention:
- the ith converter no longer being connected during the connection of the other converters when all the converters are not connected.

According to one alternative of this embodiment with rotation of the CS, the method includes the steps of:
- connection of at least one first converter;
- connection of a higher number of converters;
- then, in the event of the connection of a lower number of converters, said first converter is not connected.

According to one alternative of this embodiment with rotation of the CS, in the method, the step of rotation of the converters is carried out when the measured power value changes between the thresholds Pi−1 and Pi.

According to one alternative of this embodiment with rotation of the CS, the method includes the steps of:
- determination of the duration of use and/or of the number of use of each converter;

connection of the converters such that the duration of use and/or the number of use is more or less equal for the converters over a given period.

The methods of the invention are particularly suitable for the generators according to the invention.

BRIEF DESCRIPTION OF THE DRAWINGS

In the attached drawings:

In FIGS. 4, 6a, 6b, 7, 8, 9a and 9b, the thresholds P1 and P2 are, in a conventional manner, at ⅓ and ⅔ of the power Ppeak, in this case 28 and 56 W respectively.

DETAILED DESCRIPTION OF EMBODIMENTS OF THE INVENTION

The invention proposes a system for the electronic management of a photovoltaic generator comprising a plurality of (cell or phase) converters which may be DC/AC or DC/DC, typically three converters, connected to photovoltaic cells. The converters are electrically connected to at least one photovoltaic cell in order to collect the energy produced by this cell and transfer it to a load. The term "load" refers to the electrical application for which the energy produced by the photovoltaic generator is intended. The description that follows is given with reference to 3 converters, but it is understood that the invention applies identically to a higher number. CS will be the acronym used below to designate a (in this case static) converter.

In a conventional manner, these converters are controlled by a command known as MPPT. For example, this maximum power point tracker command MPPT can implement an algorithm which identifies the influence of a voltage change on the power delivered by the generator and causes a shift in the voltage in the direction identified as increasing the power. Thus, an algorithm of this type consists in measuring the power delivered by the generator for a first voltage and, after a certain time, in imposing a second voltage higher than the first then measuring or estimating the corresponding power. In the case where the power corresponding to the second voltage is higher than the power corresponding to the first voltage, the next step of the algorithm is to impose a third, even higher voltage. In the opposite case, the third voltage applied is lower than the first voltage. Thus, by degrees, the system can continuously adapt the voltage on the terminals of the photovoltaic generator in order to approximate as closely as possible the maximum power point. It is understood that other algorithms can be implemented for the MPPT command.

FIG. 3 shows a system of this type, and the PVG includes a photovoltaic unit 10, connected to CS 11, 12, 13 (BOOST 1, 2 and 3) and to an MPPT command 14, the output of the CS being connected to a battery 15.

The number of CS employed is a function of the power that is sent towards the CS. In a known manner, the number varies according to the detection of a threshold. In the case of 3 CS, the application of the prior art corresponds to two predetermined thresholds of change in the number of converter. As a function of the power measured by the MPPT management system, i.e. less than ⅓ Ppeak, between ⅓ and ⅔ Ppeak and more than ⅔ Ppeak, the management system then employs one, two or three converters. Other threshold values can be used if necessary.

Figure 4:
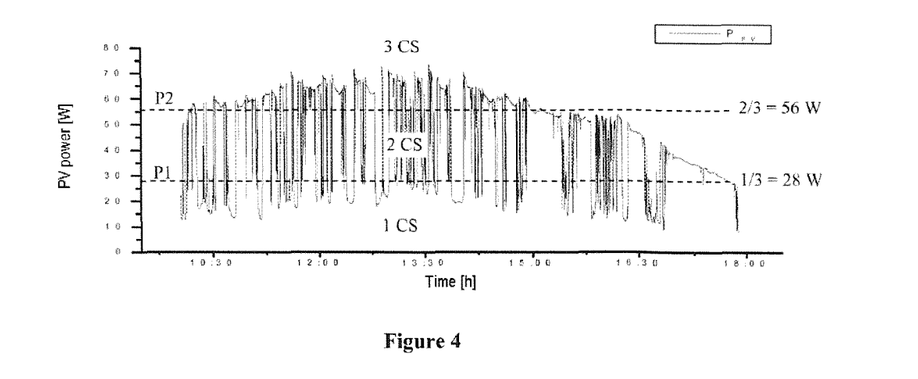
FIG. 4 shows the changes in the power and the number of CS employed as a function of the time of day.

Meteorological conditions are of course responsible for the level of power generated. When the sun is hidden by thick clouds, the insolation reduces substantially and the generated power falls, resulting in a change in the system, which switches from 3 to 1 CS. For an inverse change, the opposite happens. These changes are notably given by way of example in FIG. 4. FIG. 4 shows the generated power and the number of CS employed as a function of the time of day. In the use of this configuration with multiple CS and adaptation of the number of CS for photovoltaic applications, it can be noted that, for days of disrupted operation, as shown in FIG. 4, the device will often and quickly change the number of converter to follow climatic variations and therefore photovoltaic power variations. These fast and numerous changes will have a negative impact on the service life and reliability of the electronic components that make up the power converters.

The invention is based on the use of a power stabilization time (or lag time) t. The change in the number of CS will only be authorized after this lag time t has expired. Thus, a quick variation will not be taken into account and the number of CS will remain identical during the phase including oscillations.

This stabilization time t varies according to the system. It may typically be of the order of 3 minutes to 20 minutes, for example lying between 5 minutes and 15 minutes.

Figure 5:
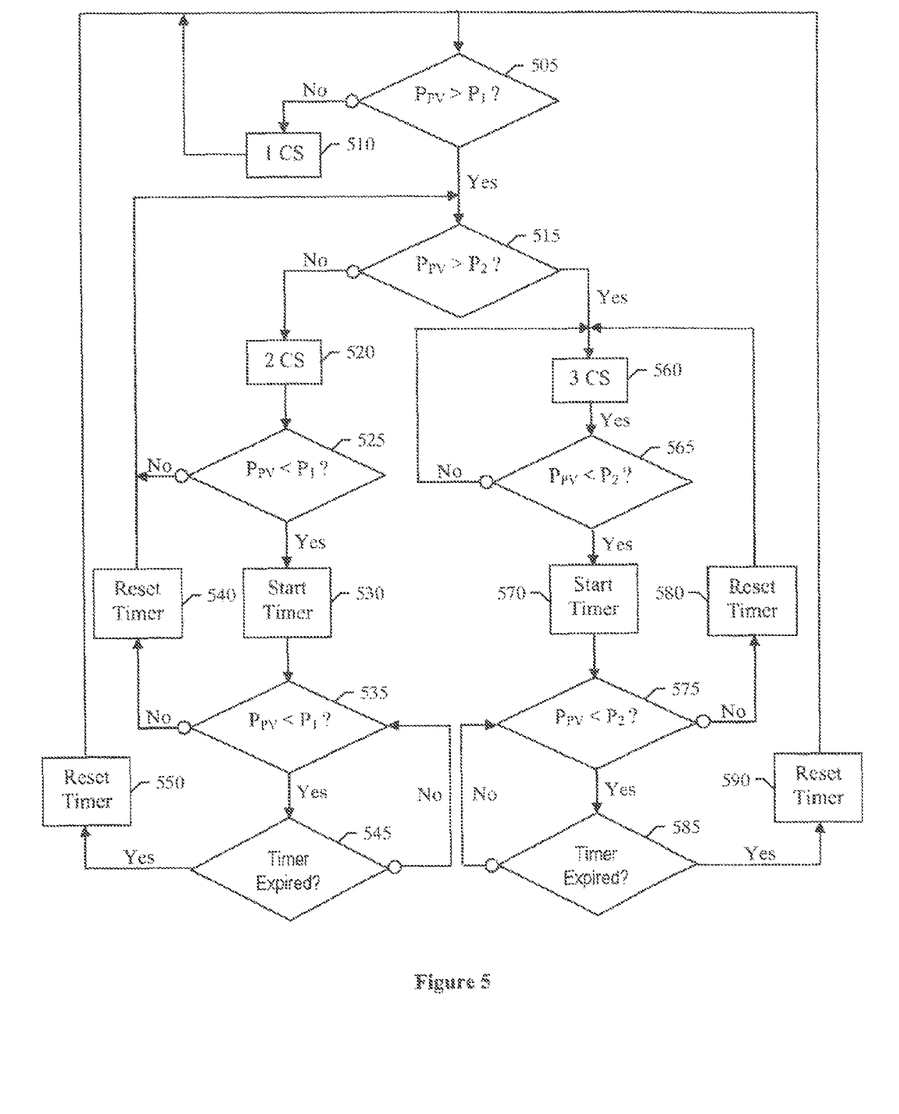
FIG. 5 shows the algorithm according to one embodiment of the invention.

A possible algorithm for the implementation of the stabilization time t is shown in FIG. 5.

The starting point is a state with a given power. In a first instance, the PV power $P_{PV}$ (which corresponds to $P_{IN}$ for the CS) is determined at a block 505.

If this power $P_{PV}$ is lower than the first threshold P1 (taken, for example, as equal to ⅓), the answer to the logical question is "no" and a single CS is employed at a block 510; the routine returns to the start. If this power $P_{PV}$ is higher than the first threshold, the answer to the logical question is "yes"; the process then moves on to the second step of the routine.

During this second step, a comparison is made with the second threshold P2 (taken, for example, as equal to ⅔) at a block 515. If this power $P_{PV}$ is lower than the second threshold P2 (taken, for example, as equal to ⅔), the answer to the logical question is "no" and two CS are then employed at a block 520; the routine then continues according to a first branch.

According to this first branch, the next logical question is again a comparison with the first threshold P1 at a block 525. If the power $P_{PV}$ is higher than the first threshold P1, the answer to the logical question is "no" and the routine returns to the start of the second step at the block 515. If the answer is "yes", the lag time is activated at a block 530. According to the prior art, the answer necessarily resulted in the transition to 1 CS. In the invention, this transition does not take place and a lag time is activated instead. From time to time, according to a defined period, the value of the power $P_{PV}$ is again measured and compared with the first threshold P1 at a block 535. If the value is higher, the answer to the logical question is "no" and the routine returns to the start of the second step at the block 515: the conditions in which 2 CS are required then prevail once more. In this case, the lag time is reset at a block 540. It is therefore evident that the fact of having waited has allowed a two-way transition between 2 states to be avoided and therefore a gain to be made in terms of system component fatigue. If, during the comparison, the value is lower than the threshold P1, the routine moves on to the next logical question at a block 545. The next logical question is the question of the expiry of the lag time.

If the response is negative, the routine returns to the preceding logical question at block 535, which is the comparison with the threshold value P1. If, therefore, during the period of the lag time t, the power value $P_{PV}$ is higher than the first threshold P1, the system considers that the number was in fact 2 CS and the system returns to the logical question of the second step at the block 515.

If the response is positive, meaning that the lag time has expired, the lag time is reset at a bloc 550, the routine switches to 1 CS and the sequence is completely restarted.

During this second step at the block 515, a comparison is made with a second threshold P2 (taken, for example, as equal to ⅔). If this power $P_{PV}$ is higher than the second threshold P2 (taken, for example, as equal to ⅔), the answer to the logical question is "yes" and 3 CS are then employed at a block 560; the routine then continues according to a second branch.

According to this second branch, the next logical question is again a comparison with the second threshold P2 at a block 565. If the power $P_{PV}$ is higher than the second threshold P2, the answer to the logical question is "no" and the routine returns to the start of the second branch. If the answer is "yes", the lag time is activated at a block 570. According to the prior art, the answer necessarily resulted in the transition to 2 (or 1) CS. In the invention, this transition does not take place and a lag time is activated instead at the block 570. From time to time, according to a defined period, the value of the power $P_{PV}$ is again measured and compared with the second threshold P2 at a block 575. If the value is higher, the answer to the logical question is "no" and the routine returns to the start of the second branch: the conditions in which 3 CS are required at the block 560 then prevail once more. In this case, the lag time is reset at a block 580. It is therefore evident that the fact of having waited has allowed a two-way transition between 2 states to be avoided and therefore a gain to be made in terms of system component fatigue. If, during the comparison, the value is lower than the threshold P2, the routine moves on to the next logical question at a block 585. The next logical question is the question of the expiry of the lag time.

If the response is negative, the routine returns to the preceding logical question at the block 575, which is the comparison with the threshold value P2. If, therefore, during the period of the lag time t, the power value $P_{PV}$ is higher than the first threshold P2, the system considers that the number was in fact 3 CS and the system returns to the logical question of the second branch.

If the response is positive, meaning that the lag time has expired, the lag time is reset at a block 590, the routine switches to 1 CS and the sequence is completely restarted. It would also be possible to switch to 2 CS rather than 1 CS and restart identically, the answer to the first logical question necessarily leading to the second.

According to one embodiment, there is no lag time during power-up. This prevents all of the power from being directed towards a single CS, which would entail a sharp increase in the temperature of the CS.

The aforementioned defined period is fixed or may vary as a function of certain, notably meteorological, conditions: there is no need to implement the routine with an insolation known to be constant. The duration of this period is highly variable, and may be of the order of seconds, tens of seconds, minutes or even more if necessary. However, the period will advantageously remain less than the stabilization period t.

Figure 6A:
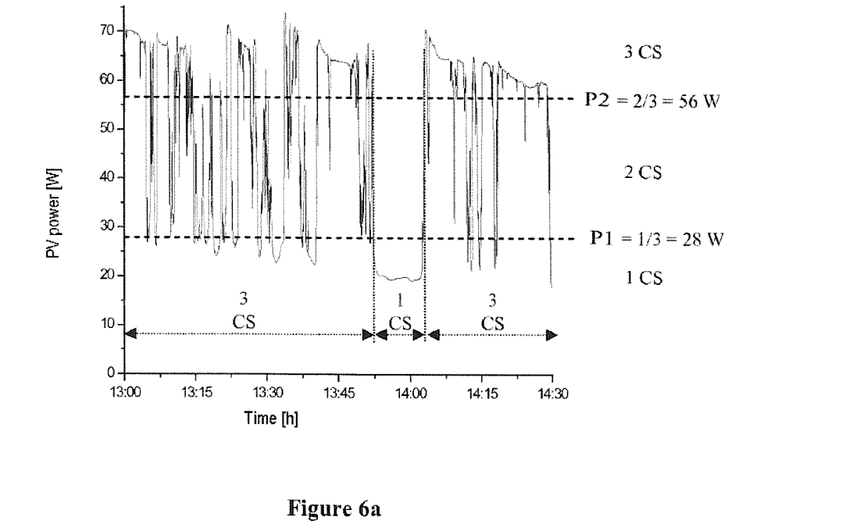
FIGS. 6a and 6b show an enlargement of two zones of the power curve as a function of the time of day with application of the invention and indication of the number of CS employed.
Figure 6B:
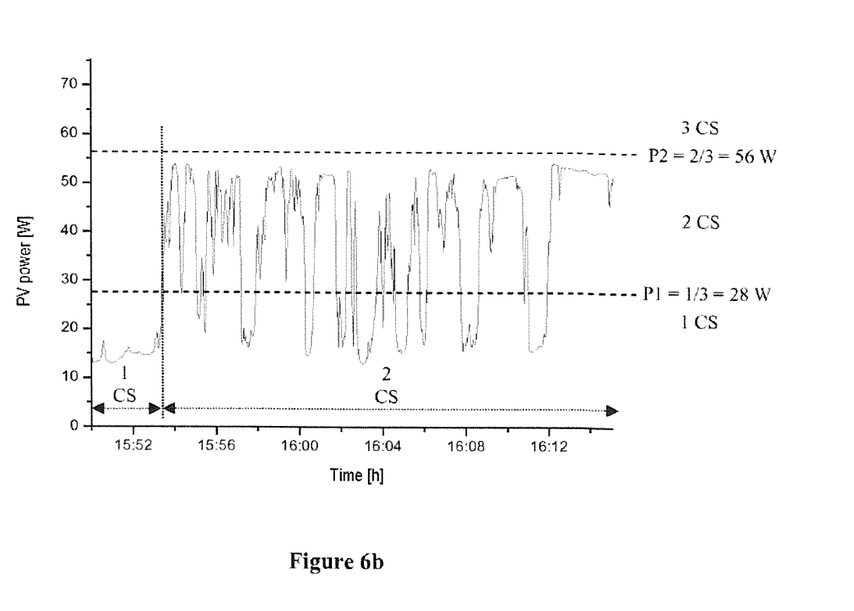

FIGS. 6a and 6b show, in an enlarged manner, the number of CS employed with the implementation of the algorithm according to the invention for two parts taken in the curve shown in FIG. 4.

FIGS. 6a and 6b show that the 2 CS case is not an active case, the system having considered that the 3 CS case is the prevailing case. In FIG. 6a, the variations are predominantly between 3 CS and 2 CS, with a very large part in the 3 CS domain. In such a case, the system considers that the PVG will operate with fewer stresses than in the 3 CS case. This situation is even more striking in FIG. 6b, since the 2 CS case would have been implemented more often with the prior art, whereas it does not occur with the invention. The invention favors the higher case, when the PVG swings between 2 states.

The use of this stabilization time has the effect of reducing the thermal and electrical stresses to which the active components are subjected during these unwanted power variations.

The thermal variations produce mechanical constraints in the semiconductors, largely due to the difference in the coefficients of expansion of the materials used in manufacture, for example 4 ppm/° C. for silicon as opposed to 16 ppm/° C. for copper and 24 ppm/° C. for aluminum.

The result of the mechanical constraints to which electrical contacts are subjected after numerous thermal cycles is the appearance of micro-cracks on the contacts, even to the point of the latter being broken.

Figure 7:
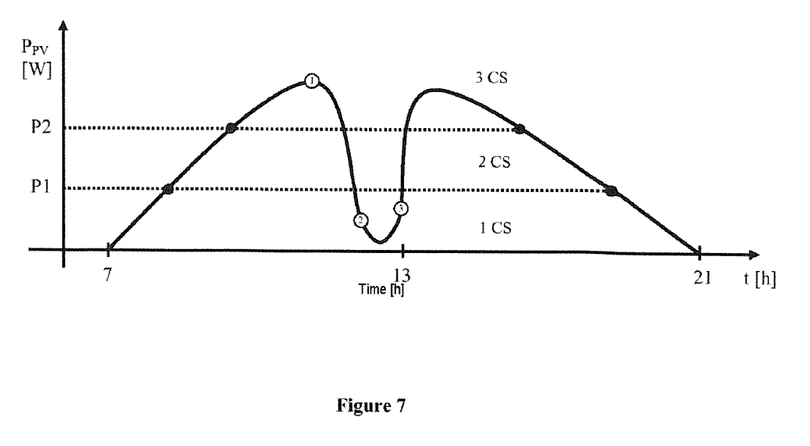
FIG. 7 shows an example of a photovoltaic production profile, with PV power ($P_{PV}$) as a function of time.

The object of the invention is to anticipate variations in order to minimize the thermal cycles by limiting abrupt temperature variations. FIG. 7 is an example of a photovoltaic production profile, with PV power ($P_{PV}$) as a function of time. In the middle of the day, for example, an abrupt drop in power is observed. In normal operation, the system will switch from point 1 (high power—3 activated converters) to point 2 (low power—1 single activated converter). Two converters will therefore stop abruptly, thus creating a thermal cycle of high $\Delta T°$.

By applying the invention, the three converters will continue to operate at point 2. The temperature of the three converters will therefore decrease progressively since the power is distributed in the three cells. If the power has not increased between points 2 and 3, two of the converters will be disconnected and therefore a single converter will operate at point 3. Thanks to this principle, it is possible to limit the extent of the $\Delta T°$ variations and therefore limit the extent of the thermal cycles.

The stabilization or lag time t is the time during which the 3 CS will be active between points 2 and 3 (or a different CS combination).

This stabilization or lag time t can be fixed in the algorithm of the system or can be modified according to a plurality of criteria.

A first criterion is the meteorology itself. Climatic conditions vary from one zone to another and therefore the lag time can be optimized according to the zone in which the PVG is installed. In fact, in certain climates, there are few alternating clouds (for example a Mediterranean climate) or, on the contrary, there may be many of them (for example an oceanic climate). The climatic conditions also vary according to the seasons and the lag time may again be adapted according to the month of use.

It is also possible to have "intelligent" learning software that will classify climatic conditions and choose the duration of the lag time according to the climatic conditions actually encountered.

A second criterion is the behavior of the components themselves, and notably their behavior as a function of the power and temperature (notably of the transistors or the system as a whole). The stabilization or lag time t can notably be modulated as a function of the temperature of the components.

According to one advantageous embodiment, the system integrates a CS rotation routine to avoid imposing continuous stress on a single CS. In fact, in FIG. 3, the converter CS 11 is continuously connected, and therefore continuously receives the current to be converted. The other CS are used according to the changes taking place in the generation of the PV power. CS 11 is therefore continuously subjected to stress, and is furthermore subjected to changes in power to be processed in the event of variations in PV power. The reliability of the system is therefore reduced as one of the components is continuously subjected to stress. According to the advantageous embodiment, there is a rotation of the CS employed.

The rotation can be controlled in the event of changes in the PV power generated by the panels or can be controlled according to the state of the converters, or both. A random allocation command can also be used.

According to one embodiment, the change of CS takes place in the event of the increase in the number of CS employed. For example, if CS 11 is connected, and the command determines that 2 CS must be used, CS 12 and 13 will then be employed, whereas CS 11 will no longer be connected. If the number of CS returns to one unit, CS 12 (or CS 13) will then be connected rather than CS 11, which will still be idle. In the case where the 3 CS must be connected, the rotation takes place during the return to 1 or 2 CS. In this case, the starting point is a situation where CS 11 is connected, then the 3 CS are connected, then the return conditions require 2 CS so CS 12 and 13 are connected or, if the return conditions require only 1 CS, CS 12 or 13 will be connected.

According to a different embodiment, the change of CS takes place due to a calculation of the use of the CS. This calculation can be based on the duration of use, the rotation being carried out in such a way as to ensure a duration of use more or less equal for all the CS over a given period. This period may be one day, several days or a fraction of a day, for example one or more hours, wherein this duration may also be a function of the time of day and/or the season. Thus, according to this embodiment, the CS that must be employed is the one that has been least used, i.e. the one having the least usage time. The calculation can also be carried out by counting the number rather than the duration of use or stresses of the CS, independently of the duration of use. In this case, the CS that must be employed is therefore the one that has been stressed the least number of times. It is also possible to envisage an embodiment in which the two variants are combined.

According to a different embodiment, it is possible for the rotation to be carried out in a random manner, a random generator then being provided in the management system. In the event of the increase or reduction in the number of CS, the choice is made in a random manner, possibly in "shuffle" mode if necessary (this mode corresponds to a mode in which the CS that has been used is excluded from the random selection).

In the description above, the CS rotation is carried out when there is a change in the number of CS employed. It is of course possible to provide for this rotation to take place when the number of CS employed is constant (insofar as it is different from the maximum number). Thus, when the meteorological conditions are such that only one CS is employed, a routine can be provided that exchanges this CS with a CS initially idle, in such a way that one CS is not used continuously for more than a given duration.

The rotation of the converters employed has the effect of further reducing the thermal and electrical stresses to which the active components are subjected in the event of power variations. As indicated above, the thermal variations produce mechanical constraints in the semiconductors, the result of which is the appearance of micro-cracks on the contacts, even to the point of the latter being broken. The object of the embodiment with CS rotation is to distribute the thermal and electrical stress over all of the converters.

The electronic management system according to the invention may also include safety functions, controlling the shutdown of the converters following a message indicating, for example, overheating of the components of the PVG. The electronic management system according to the invention may also include an anti-theft function. The management system according to the invention may furthermore transmit information relating to the operating condition of the groups of cells and/or the converters to a control centre of an electrical network. This facilitates the maintenance of the PVGs. In particular, the operator responsible for maintenance is thus alerted more quickly to a malfunction of certain groups of photovoltaic cells or certain converters and may consequently undertake measures.

The management system according to the invention may be totally or partially integrated into a photovoltaic generator.

According to one possible embodiment, multi-junction photovoltaic devices can be used. It then becomes necessary to manage the problem of electrical coupling of the different junctions. A multi-junction photovoltaic device, for example a tandem-junction device, refers to a photovoltaic device comprising a plurality of single junctions stacked in such a way as to increase the zone of solar spectrum absorption by the device. Tandem-junction photovoltaic devices allow a better electrical conversion output to be obtained. The main disadvantage of the electrical coupling in a tandem-junction photovoltaic device is the need for a harmonization in the performances of the photovoltaic cells that make up the tandem, regardless of the insolation conditions. This ideal case is not feasible in reality since the current production of each cell of the tandem is spontaneously different according to the region of the spectrum in which they are active, and varies as a function of the insolation conditions. This results in an intrinsic limitation of the tandem-junction photovoltaic device by the weakest of its elements. A current limitation of this type substantially reduces the theoretical output of a tandem-junction photovoltaic device. One solution consists in electrically decoupling the junctions of a tandem-junction photovoltaic device. The photovoltaic cells of the tandem are still optically coupled but are electrically decoupled. Each junction is then connected to two electrical electrodes; a four-electrode photovoltaic device is thus obtained (in the case of a tandem). By connecting the converters to each (at least one) photovoltaic cell of the tandem, the system allows a multi-junction photovoltaic device to be obtained that operates with electrically decoupled photovoltaic cells, each one managed in an optimum manner via the management system according to the invention.

The following examples illustrate the invention without limiting it.

EXAMPLE

In this example, the effect is measured in terms of the output loss of the application of the invention.

Figure 10:
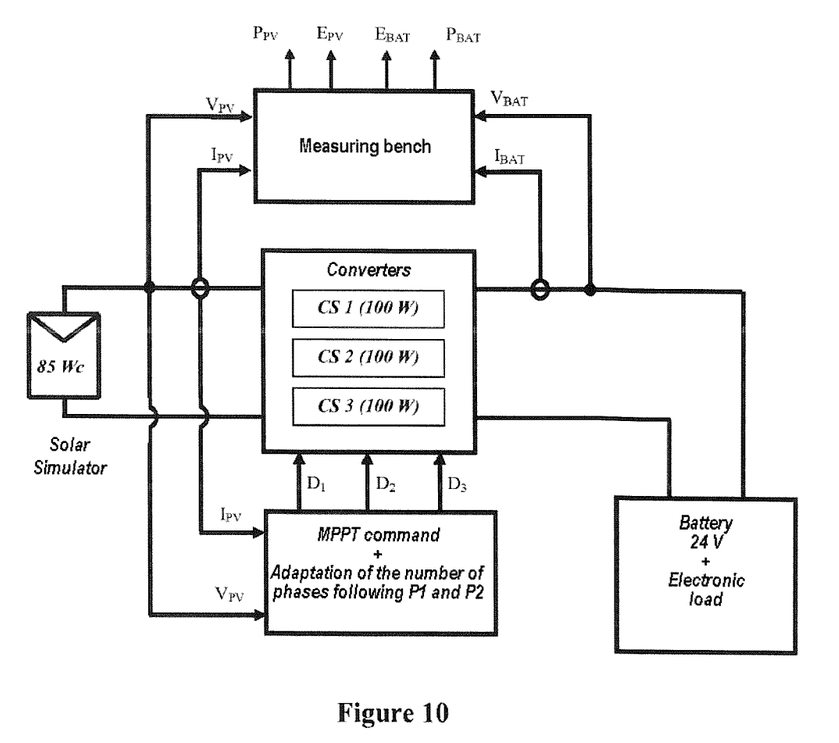
FIG. 10 shows the measurement device used.

The test protocol chosen to evaluate the energy gain achieved by the method according to the invention consisted in using the same input source (solar simulator) and the same multi-phase power card (behavior of identical electrical components). The simulator allowed the application in both cases of the same power profile (for example the production of a module with a peak power of 85 W over a relatively sunny day), whereas the MPP was obtained using the same MPPT command. During this test, a 24 V battery was used to which an electronic load was connected in order to guarantee continuously the nominal voltage of the latter (24 V). FIG. 10 shows the measurement system used.

On the basis of the measuring bench, the current and the voltage present at the input and at the output of the converter are simultaneously measured. These values allow the PV power (PPV) supplied by the simulator and the power transmitted to the battery (PBAT) and therefore the output of the converter (PBAT/PPV) to be deduced. By taking into account the time variable (test duration in hours), the quantity of PV energy produced (EPV) and transferred to the battery (EBAT) is then calculated.

The thresholds used are the conventional thresholds of ⅓ and ⅔.

Figure 8:
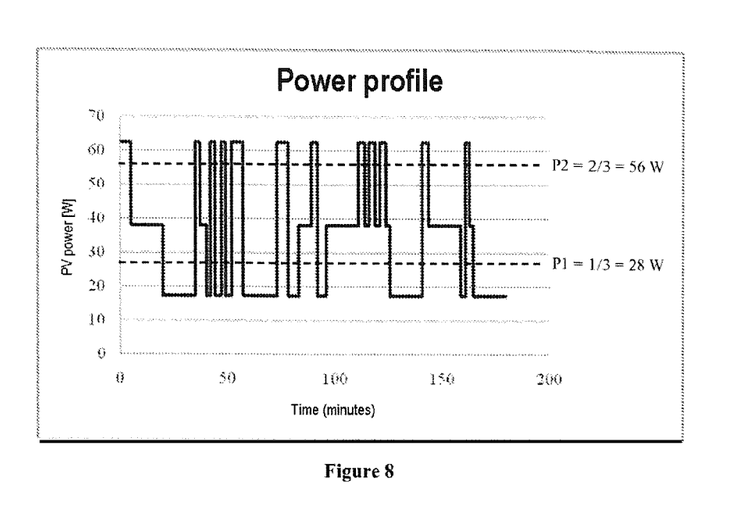
FIG. 8 shows a simulated power profile.

The power profile of the simulator is shown in FIG. 8.

The value of the stabilization time t is fixed in the example at 10 minutes.

Figure 9A:
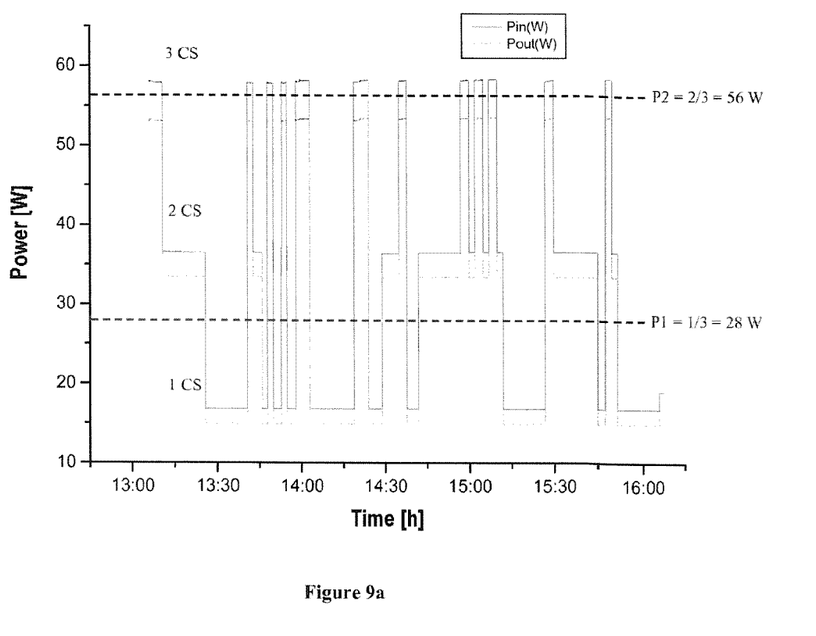
FIGS. 9a and 9b show the values of $P_{in}$ and $P_{out}$ in the cases without and with the algorithm of the invention.
Figure 9B:
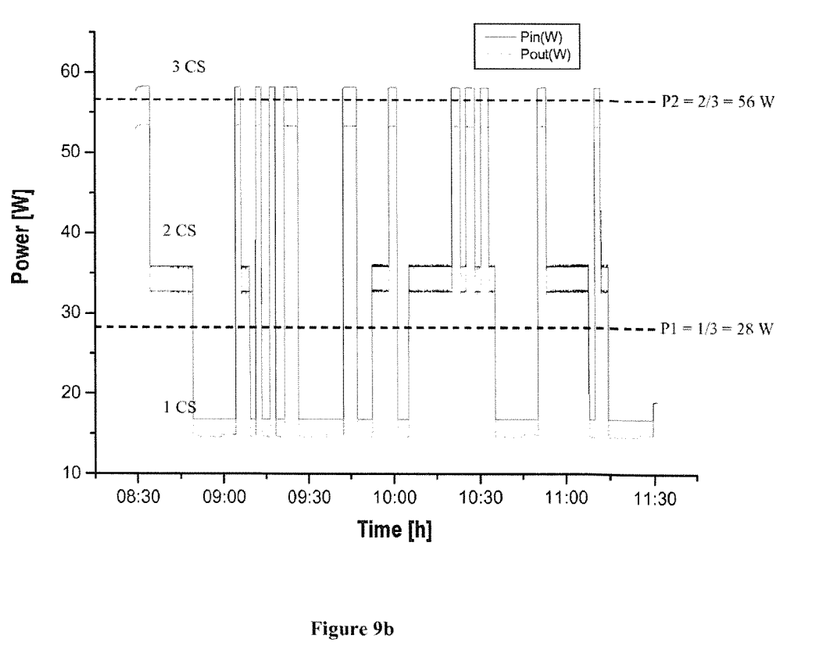

FIGS. 9a and 9b show the values of $P_{in}$ and $P_{out}$ in the cases with and without the algorithm of the invention. It is noted, in the case according to the invention, that when the number of CS reverts from 3 to 1, a slight decoupling occurs in the output power, resulting in a gain in terms of output (for low powers, the output is better with a single CS).

The following results are obtained:

| | PV energy [Wh] | Battery energy [Wh] | dc-dc output [%] |
|---|---|---|---|
| Comparative | 96.69 | 87.81 | 90.8 |
| Invention | 96.06 | 86.97 | 90.5 |

According to this table and as one could without doubting the use of this algorithm reduces the conversion output of the power stage by 0.3%. However, this reduction remains within an acceptable limit. Conversely, the thermal constraints and stress endured by the components are minimized, resulting in an increase in the service life of the adaptation stage. The balance is positive.

The invention claimed is:

1. An electronic control system of a photovoltaic generator having at least one cell, the electronic control system comprising:
a plurality of n parallel coupled static converters, each of said plurality of static converters configured for being selectively coupled to at least one of the at least one cells of the photovoltaic generator, wherein a connection including a select number of said plurality of static converters is selected in accordance with a variation in photovoltaic power determined by comparing power generated by the at least one cells to power threshold values P1, P2, . . . Pn−1, the connection including i static converters of said plurality of static converters if a first connection condition corresponding to a measured power value between Pi−1 and Pi is satisfied, and the connection including each static converter of said plurality of static converters if a second connection condition corresponding to a measured power value greater than Pn−1 is satisfied, wherein the connection is made only after a delay time t if the corresponding first connection condition or the corresponding second connection condition is still satisfied.

2. The system according to claim 1 wherein said plurality of n parallel coupled static converters is provided as three parallel coupled static converters.

3. The system according to claim 1 wherein the delay time t is between about three minutes and about twenty minutes.

4. The system according claim 1 wherein each of said plurality of static converters are comprised of components and the value of the delay time t depends upon a state of the components of said plurality of static converters.

5. The system according to claim 1 wherein the value of the delay time t depends upon weather conditions, chosen especially from weather conditions associated with a geographic region at which the photovoltaic generator is located and a season of the year.

6. The system according to claim 1 wherein said plurality of n parallel coupled static converters are connected in turn.

7. The system according to claim 6 wherein a rotation of said plurality of n parallel coupled static converters is determined based on the variation in the number of said plurality of n parallel coupled converters engaged.

8. The system according to claim 7 wherein:
each of said plurality of parallel coupled static converters are comprised of components; and
the rotation of said plurality of n parallel coupled static converters depends upon a state of the components of the converters.

9. A photovoltaic generator comprising:
at least one photovoltaic cell;
a plurality of n parallel coupled static converters, each of said plurality of static converters configured for being selectively coupled to at least one of the at least one cells of the photovoltaic generator; and
a management system to determine when each of said plurality of converters should be selectively coupled to at least one of the at least one cells of the photovoltaic generator, wherein a connection including a select number of said plurality of converters connected is selected in accordance with a variation in photovoltaic power determined by comparing a measured power value of power generated by the at least one photovoltaic cell with threshold values P1, P2, . . . Pn−1, the connection including i static converters of said plurality of static converters if a first connection condition corresponding to a measured power value between Pi−1 and Pi is satisfied, and the connection including each static converter of said plurality of static converters if a second connection condition corresponding to a measured power value greater than Pn−1 is satisfied, wherein the connection is made only after a delay time t if the corresponding first connection condition or the corresponding second connection condition is still satisfied.

10. A method of controlling a photovoltaic generator having at least one photovoltaic cell and a plurality of n parallel coupled converters, each of the plurality of converters configured for being selectively electrically connected to at least one of the at least one photovoltaic cells, the method comprising:

measuring an amount of power generated by the at least one photovoltaic cell and determining a measured power value based upon the measured amount of power;

comparing the amount of power generated by the at least one photovoltaic cell with a peak power value;

comparing the amount of power generated by the at least one photovoltaic cell to threshold values P1, P2, ... Pn−1; and establishing a connection including a select number of the plurality of converters, the connection including i converters of the plurality of converters if a first connection condition corresponding to a measured power value between Pi−1 and Pi is satisfied, and the connection including each static converter of the plurality of converters if a second connection condition corresponding to a measured power value greater than Pn−1 is satisfied, wherein connection is made only after a delay time t if the corresponding first connection condition or the corresponding second connection condition is still satisfied.

11. The method according to claim 10 wherein comparing the amount of power generated by the at least one photovoltaic cell to threshold values P1, P2, ... Pn−1 comprises:

comparing the amount of power generated by the at least one photovoltaic cell with a threshold value P1;

(a) if the power generated by the at least one photovoltaic cell is below the threshold value P1, then connecting a single one of the plurality of converters;

(b) if the power generated by the at least one photovoltaic cell is greater than the threshold value P1, then comparing the power generated by the at least one photovoltaic cell to a second threshold value P2;

(b1) if the power generated by the at least one photovoltaic cell is less than the second threshold value P2, connecting two of the plurality of converters;

(b1)(1) then comparing the power generated by the at least one photovoltaic cell to the first threshold P1, and if the power generated by the at least one photovoltaic cell is greater than this threshold then returning to (b); and if the power generated by the at least one photovoltaic cell is below threshold P1, then identifying a trigger time t;

(b1)(2) if a timer was triggered, then comparing the power generated by the at least one photovoltaic cell to the first threshold P1 and if the power generated by the at least one photovoltaic cell exceeds the threshold, then returning to (b) and setting the delay to zero; and if the power generated by the at least one photovoltaic cell is below the threshold value P1, making a determination of the delay time and comparing the power generated by the at least one photovoltaic cell to the threshold value P1;

(b1)(3) when the delay time has elapsed, returning to (a)

(b2) if the power generated by the at least one photovoltaic cell is greater than a second threshold value P2, then connecting three (3) of the plurality of converters, (b2)(1) then comparing the power generated by the at least one photovoltaic cell to the second threshold value P2, and if the power generated by the at least one photovoltaic cell is greater than the threshold value P2, returning to (b2); and if the power generated by the at least one photovoltaic cell is less than threshold value P2, triggering a new timer t;

(b2a)(2) if the timer was triggered, then comparing the second threshold value P2 to the power generated by the at least one photovoltaic cell, and if the power generated by the at least one photovoltaic cell exceeds the threshold value P2, returning to step (b2) having given the delay to zero; and if the power generated by the at least one photovoltaic cell is below threshold value P2, there is determination of the elapse of the delay time and if the delay time has not elapsed, the comparison to the value P2 is resumed;

(b2)(3) when the delay time has elapsed, returning to one of (a) or (b); and repeating (a) and (b) for each of the plurality of converters.

12. The method of claim 11 further comprising:

in response to the determined power generated by the at least one photovoltaic cells being below a threshold value, connecting additional converters when all converters are not connected.

13. The method of claim 12 further comprising:

connecting at least a first one of the plurality of n parallel coupled converters to at least one of the at least one photovoltaic cells; and connecting a number of the plurality of n parallel coupled converters to at least one of the at least one photovoltaic cells which is larger than the least first one of the plurality of n parallel coupled converters; and in response to a need to reduce the number of the plurality of n parallel coupled converters to at least one of the at least one photovoltaic cells, disconnecting the first one of the plurality of n parallel coupled converters.

14. The method of claim 12 further comprising rotating the plurality of n parallel coupled converters in response to the measured power value changes being between the thresholds Pi and Pi−1.

15. A method according to claim 12 further comprising:

determining one or more of: the duration of utilization and/or number of utilization of each the plurality of n parallel coupled converters;

connecting each of the plurality of n parallel coupled converters such that over time, one or more of duration of use and/or the number of use is equal amongst the plurality of n parallel coupled converters.

16. The method of claim 10 wherein comparing the amount of power generated by the at least one photovoltaic cell to threshold values P1, P2, ... Pn−1 comprises:

comparing with a threshold value P1 in a management system for controlling the photovoltaic generator;

(a) if the power generated by the at least one photovoltaic cell is below the threshold value P1, then connecting a single one of the plurality of converters;

(b) if the power generated by the at least one photovoltaic cell is greater than the threshold value P1, then comparing the power generated by the at least one photovoltaic cell to a second threshold value P2;

(b1) if the power generated by the at least one photovoltaic cell is less than the second threshold value P2, connecting two of the plurality of converters;
  (b1)(1) then comparing the power generated by the at least one photovoltaic cell to the first threshold P1, and
    if the power generated by the at least one photovoltaic cell is greater than this threshold then returning to (b); and
    if the power generated by the at least one photovoltaic cell is below threshold P1, then identifying a trigger time t;
  (b1)(2) if a timer was triggered, then comparing the power generated by the at least one photovoltaic cell to the first threshold P1 and
    if the power generated by the at least one photovoltaic cell exceeds the threshold, then returning to (b) and setting the delay to zero; and
    if the power generated by the at least one photovoltaic cell is below the threshold value P1, making a determination of the delay time and comparing the power generated by the at least one photovoltaic cell to the threshold value P1;
  (b1)(3) when the delay time has elapsed, returning to (a)
(b2) if the power generated by the at least one photovoltaic cell is greater than a second threshold value P2, then connecting three (3) of the plurality of converters,
  (b2)(1) then comparing the power generated by the at least one photovoltaic cell to the second threshold value P2, and
    if the power generated by the at least one photovoltaic cell is greater than the threshold value P2, returning to (b2); and
    if the power generated by the at least one photovoltaic cell is less than threshold value P2, triggering a new timer t;
  (b2)(2) if the timer was triggered, then comparing the second threshold value P2 to the power generated by the at least one photovoltaic cell, and
    if the power generated by the at least one photovoltaic cell exceeds the threshold value P2, returning to step (b2) having given the delay to zero; and
    if the power generated by the at least one photovoltaic cell is below threshold value P2, there is a determination of the elapse of the delay time, and if the delay time has not elapsed, the comparison to the value P2 is resumed;
  (b2)(3) when the delay time has elapsed, returning to one of (a) or (b).

* * * * *